US006984076B2

(12) United States Patent
Walker, Jr. et al.

(10) Patent No.: US 6,984,076 B2
(45) Date of Patent: Jan. 10, 2006

(54) COMPACT PACKAGE DESIGN FOR VERTICAL CAVITY SURFACE EMITTING LASER ARRAY TO OPTICAL FIBER CABLE CONNECTION

(75) Inventors: Harold Y. Walker, Jr., Plano, TX (US); Klein L. Johnson, Orono, MN (US); Yue Liu, Plymouth, MN (US); Bo Su Chen, Plano, TX (US)

(73) Assignee: Honeywell International Inc., Morristown, NJ (US)

( * ) Notice: Subject to any disclaimer, the term of this patent is extended or adjusted under 35 U.S.C. 154(b) by 68 days.

(21) Appl. No.: 10/680,201

(22) Filed: Oct. 8, 2003

(65) Prior Publication Data
US 2005/0078720 A1    Apr. 14, 2005

(51) Int. Cl.
*H01S 3/04* (2006.01)

(52) U.S. Cl. ............ 385/94; 372/36; 369/112.19

(58) Field of Classification Search ............ 385/88, 385/92, 93, 94, 147; 372/29.013, 29.022, 372/36, 50, 98, 99, 109; 252/99, 109, 678, 252/680, 703, 704, 705, 706, 729, 730, 731, 252/690, 693, 431, 432, 433, 434, 778, 779, 252/780; 438/106–116, 121–129
See application file for complete search history.

(56) References Cited

U.S. PATENT DOCUMENTS

| | | | |
|---|---|---|---|
| 6,064,488 A | 5/2000 | Brand | |
| 6,275,313 B1 | 8/2001 | Denkin et al. | |
| 6,318,901 B1 | 11/2001 | Heremans et al. | |
| 6,531,341 B1 | 3/2003 | Peterson | |
| 6,594,050 B2 | 7/2003 | Jannson | |
| 6,597,713 B2 * | 7/2003 | Ouchi | 372/36 |
| 6,636,540 B2 | 10/2003 | Uebbing | |
| 6,661,084 B1 | 12/2003 | Peterson | |
| 6,674,159 B1 | 1/2004 | Peterson | |
| 2002/0176468 A1 | 11/2002 | Kaneko | |
| 2003/0015776 A1 | 1/2003 | Recktenwald | |
| 2003/0026303 A1 | 2/2003 | Ouchi | |
| 2003/0081645 A1 | 5/2003 | Uebbing | |
| 2003/0127661 A1 | 7/2003 | Takagi | |
| 2003/0137022 A1 | 7/2003 | Dautartas | |

* cited by examiner

*Primary Examiner*—John R. Lee
*Assistant Examiner*—David A Vanore
(74) *Attorney, Agent, or Firm*—McKenna Long & Aldridge (57) ABSTRACT

A housing for opto-electronic array devices. The housing includes a base and walls that form a region that receives an opto-electronic semiconductor array. Conductive traces are disposed on a wall such that a front part of the traces are exposed for external electrical connections, while the back part is exposed for internal electrical connections. A transparent substrate having a plurality of micro-lenses cover the base, walls and opto-electronic semiconductor array device. Each micro lens is beneficially made from optical epoxy that is deposited by an ink-jet nozzle. The base and walls are beneficially comprised of a ceramic.

23 Claims, 8 Drawing Sheets

COMPACT PACKAGE DESIGN FOR VERTICAL CAVITY SURFACE EMITTING LASER ARRAY TO OPTICAL FIBER CABLE CONNECTION

CROSS-REFERENCE TO RELATED APPLICATIONS

This application is related to a co-pending U.S. patent application entitled: "Compact package design for vertical cavity surface emitting laser array to optical fiber cable connection" U.S. Ser. No. 10/607,982, filed on Jun. 30, 2003.

BACKGROUND OF THE INVENTION

1. Field of the Invention

This invention relates to the packaging of opto-electronic semiconductor arrays, specifically including vertical cavity surface emitting laser arrays and photodetector arrays.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific device characteristics. In particular, the various material systems can be tailored to emit different wavelengths, such as 1550 nm, 1310 nm, 850 nm, 670 nm, and so on.

VCSELs include semiconductor active regions, distributed Bragg reflector (DBR) mirrors, current confinement structures, substrates, and contacts. Because of their complicated structure, and because of their material requirements, VCSELs are usually grown using metal-organic chemical vapor deposition (MOCVD) or molecular beam epitaxy (MBE).

Figure 1:
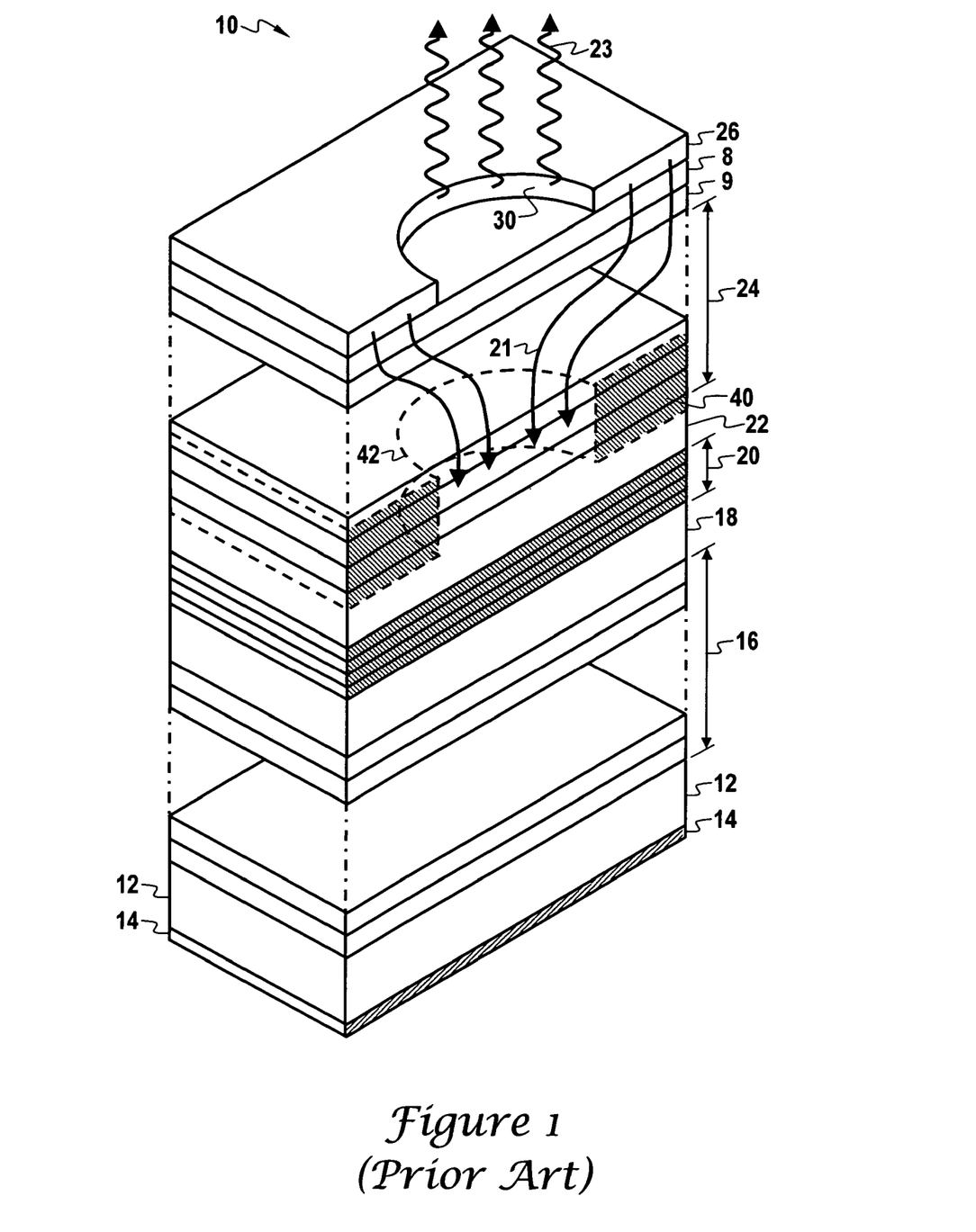
FIG. 1 illustrates a typical vertical cavity surface emitting laser.

FIG. 1 illustrates a typical VCSEL 10. As shown, an n-doped gallium arsenide (GaAs) substrate 12 has an n-type electrical contact 14. An n-doped lower mirror stack 16 (a DBR) is on the substrate 12, and an n-type graded-index lower spacer 18 is disposed over the lower mirror stack 16. An active region 20, usually having a number of quantum wells, is formed over the lower spacer 18. A p-type graded-index top spacer 22 (another confinement layer) is disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonate at specific wavelengths, the mirror separation is controlled so as to resonant at a predetermined wavelength (or at a multiple thereof). At least part of the top mirror stack 24 includes an insulating region 40, formed by implanting ions (protons), that provides current confinement. Alternatively, the insulating region 40 can be formed using an oxide layer, for example, in accordance with the teachings of U.S. Pat. No. 5,903,588, which is incorporated by reference. In either case, the insulating region 40 defines a conductive annular central opening 42 that forms an electrically conductive path through the insulating region 40.

In operation, an external bias causes an electrical current 21 to flow from the p-type electrical contact 26 toward the n-type electrical contact 14. The insulating region 40 and the conductive central opening 42 confine the current 21 such that it flows through the conductive central opening 42 to the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a common VCSEL structure, and that numerous variations are possible. For example, the doping can be changed (say, by providing a p-type substrate 12), different material systems can be used, operational details can be tuned for maximum performance, and additional structures, such as tunnel junctions, can be added.

Figure 2:
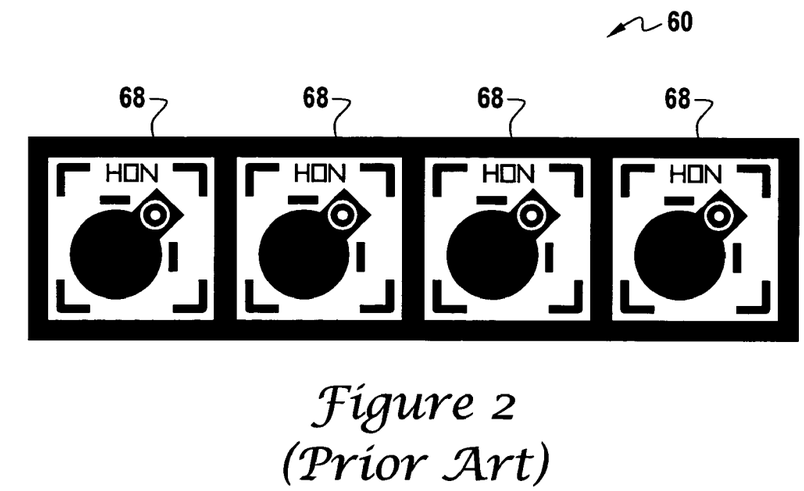
FIG. 2 illustrates a top down view of a typical 4 element VCSEL array.
Figure 3:
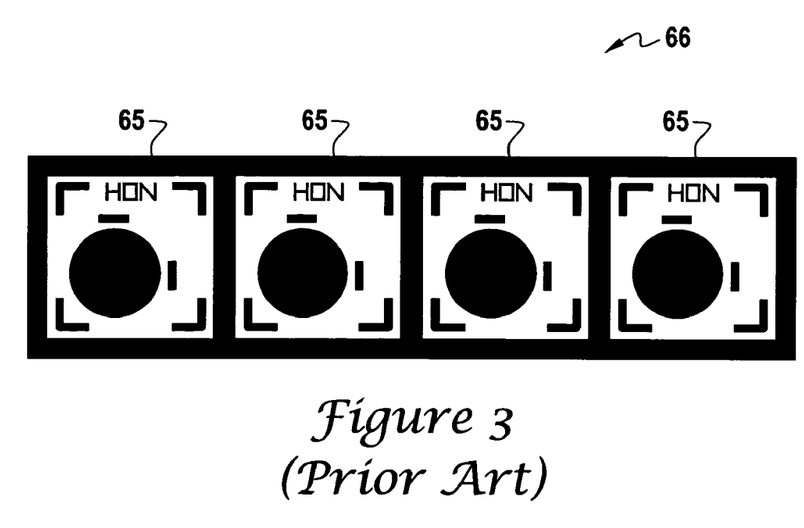
FIG. 3 illustrates a top down view of a typical 4 element photodetector array.

While individual VCSELs are of great interest, some applications can benefit from arrays of VCSEL elements. For example, FIG. 2 illustrates a VCSEL array 60 comprised of four, evenly spaced, individual VCSEL elements 68, each of which could be in accord with FIG. 1. Many applications can also benefit from photodetector arrays that optically mate with VCSEL arrays. Turning now to FIG. 3, such a photodetector array 66 can be comprised of individual, evenly spaced, photodetectors 65. In practice, the individual VCSELs 68 of a VCSEL array 60, and the individual photodetectors of a detector array 66 are usually spaced the same distance apart, for example, 250 microns. While FIGS. 2 and 3 show 4 element arrays, in practice opto-electronic arrays can have different numbers of individual elements, with 12 element arrays being fairly common.

While generally successful, VCSEL arrays and matching photodetector arrays have their problems. One particular problem is interconnecting VCSEL arrays and/or photodetector arrays with higher-level systems. Such interconnections often require both electrical connections to another structure (such as a printed circuit board) and optical coupling with optical fibers. Common design requirements of electrical connections for high-speed communication applications include short lead length and bound wire length for well-controlled line input, termination impedances, and low parasitic capacitances.

Optically coupling VCSEL and/or photodetector array substrates to optical fibers present additional problems. For example, a precise physical alignment between VCSEL and/or photodetector array elements and optical fibers is often required. Indeed, in some applications the optical alignment must be within a micron or so. Prior art optical alignment techniques approaches include molded lens coupling, butt coupling, and butt coupling with V-groove alignment. In the cases of using fiber butt coupling techniques, fiber facets must be positioned to be very close to the active region of VCSEL or photodetector array chip, which leads to several undesired packaging limitations. It would be difficult or even almost impossible to form a hermetic package if a glass window is inserted. Furthermore, electrical bond pads are often forced to be positioned away from the active regions in order to make room for optical fiber interface. This leads to added cost as chip dimension increases and chip yield per wafer decreases. Moreover, parasitic capacitance increases as electrical lead length increases. Molded external plastic lens is also not a good typical solution for a hermetic package. Molded plastic lens array typically has a significantly higher coefficient of thermal expansion (hereinafter "CTE"). A large CTE mismatch between the VCSEL/photodetecter array, lens array and the fiber array can cause optical coupling efficiency variation among array elements, thereby limiting the operation temperature range of the assembly.

In view of the foregoing problems, a new technique of packaging opto-electronic semiconductor arrays would be beneficial. Even more beneficial would be a new packaging system having a submount for receiving opto-electronic semiconductor arrays, such as VCSEL or photo-detector arrays, such that those arrays interface with optical fibers. Even more beneficial would be an electrically connectable packaging assembly that facilitates electrical connections between opto-electronic semiconductor arrays and external circuitry, while providing for optical interfacing with optical fibers. Still more beneficial would be an electrically connectable packaging assembly that facilitates electrical connections between packaged opto-electronic semiconductor arrays and external circuitry, while providing for optical interfacing with optical fibers by way of a micro lens array. Beneficially, such a micro lens array would be easily producible in large quantities at a low cost and of high optical quality. Also beneficial would be a technique of forming such micro lens arrays by ejecting, such as by ink jet ejection, optical epoxy onto a transparent substrate, such as a glass substrate, for example. Still more beneficial would be such a lens array formed on a transparent substrate that can provide hermetical seal to opto-electronic devices and device arrays. Still more beneficial would be such a lens array formed on a transparent substrate that provides superior CTE match with opto-electronic device arrays and fiber array connectors such that there is more robust optical coupling over a wide operation temperature range between the array components. Still more beneficial would be a new technique of interconnecting arrays of semiconductor-based optical elements, such as VCSEL and/or photo detector arrays, with parallel optical fibers.

SUMMARY OF THE INVENTION

Accordingly, one aspect of the present invention is directed to a novel, compact housing package design for opto-electronic semiconductor array-to-optical fiber cable connections that substantially obviates one or more of the problems due to limitations and disadvantages of the related art.

Another aspect of the present invention is directed to a creating a micro-lens array using optical epoxy and an ink jet ejection method that substantially obviates one ore more of the problems due to limitations and disadvantages of the related art.

Another advantage of the present invention is that a micro-lens array can be manufactured at a low cost by printing lenses on a large transparent substrate.

Another advantage of the present invention is that such a micro-lens array can provide hermetic seal to opto-electronic devices inside.

Another advantage of the present invention is that such a micro-lens array has a very good CTE match with opto-electronic device arrays, such as VCSEL or photodetector array.

Another advantage of the present invention is a means of interconnecting opto-electronic semiconductor arrays, such as VCSEL arrays and photodetector arrays, with parallel optical fibers in a manner that is suitable for high-speed data communications and telecommunications.

Another advantage of the present invention is that it provides for a relatively low cost vertical-walled submount that supports an opto-electronic semiconductor array. Beneficially, that submount includes a top transparent substrate such as a glass substrate. Such a glass substrate is particularly well suited, among others, for receiving ink jet deposited micro lens arrays.

An opto-electronic semiconductor housing package according to the principles of the present invention includes a vertical-walled submount having a plurality of conductive traces. Such conductive traces are beneficial in electrically interconnecting with an opto-electronic semiconductor array that is attached to the submount. Furthermore, the submount has a plurality of walls extending up from the submount to support a top transparent substrate. Additionally, a plurality of bonding wires electrically connects the individual array elements to a plurality of conductive traces.

An alternative opto-electronic semiconductor housing package according to the principles of the present invention includes a submount having a plurality of conductive traces. The submount includes sufficient walls to encircle an opto-electronic semiconductor array. The individual opto-electronic elements electrically interconnect externally through the conductive traces. Furthermore, bonding wires electrically connect the individual opto-electronic elements to the conductive traces. Finally, a top transparent substrate encloses the semiconductor array within the submount. The top transparent substrate beneficially includes micro-lens that optically align with the individual opto-electronic elements.

In any of the above embodiments, the opto-electronic semiconductor housing package according to the principles of the present invention is beneficially used with an array of semiconductor and/or individual opto-electronic elements, for example, a 1×12 VCSEL array that operates in conjunction with a micro lens array.

The micro lens array may be supported by the top transparent substrate that, in turn, rests upon at least two vertical walls of the submount. The micro lens array may be made from optical-grade epoxy that is ejected or otherwise dropped onto the top transparent substrate, preferably by an ink-jet ejection method. The optical-grade epoxy that forms the micro lens array may also be used secure the top transparent substrate to the at least two vertical wall sections.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6A, 6B and 6C illustrate a side cut-away view of the housing assembly shown in FIG. 5, where FIG. 6A shows the micro lens array located on both sides of the top transparent substrate, FIG. 6B shows the micro lens array located on the top side of the top transparent substrate, and FIG. 6C shows the micro lens array located on the bottom side of the top transparent substrate;

Note that in the drawings that like numbers designate like elements. Additionally, for explanatory convienence this document uses directional signals such as up and down, top and bottom, and lower and upper. Those signals are derived from the relative positions of the elements as illustrated in the drawings. Such signals are meant to aid understanding the present invention, not to limit it.

DETAILED DESCRIPTION OF THE ILLUSTRATED EMBODIMENTS

Reference will now be made in detail to embodiments of the present invention, examples of which are illustrated in the accompanying drawings.

Figure 4:
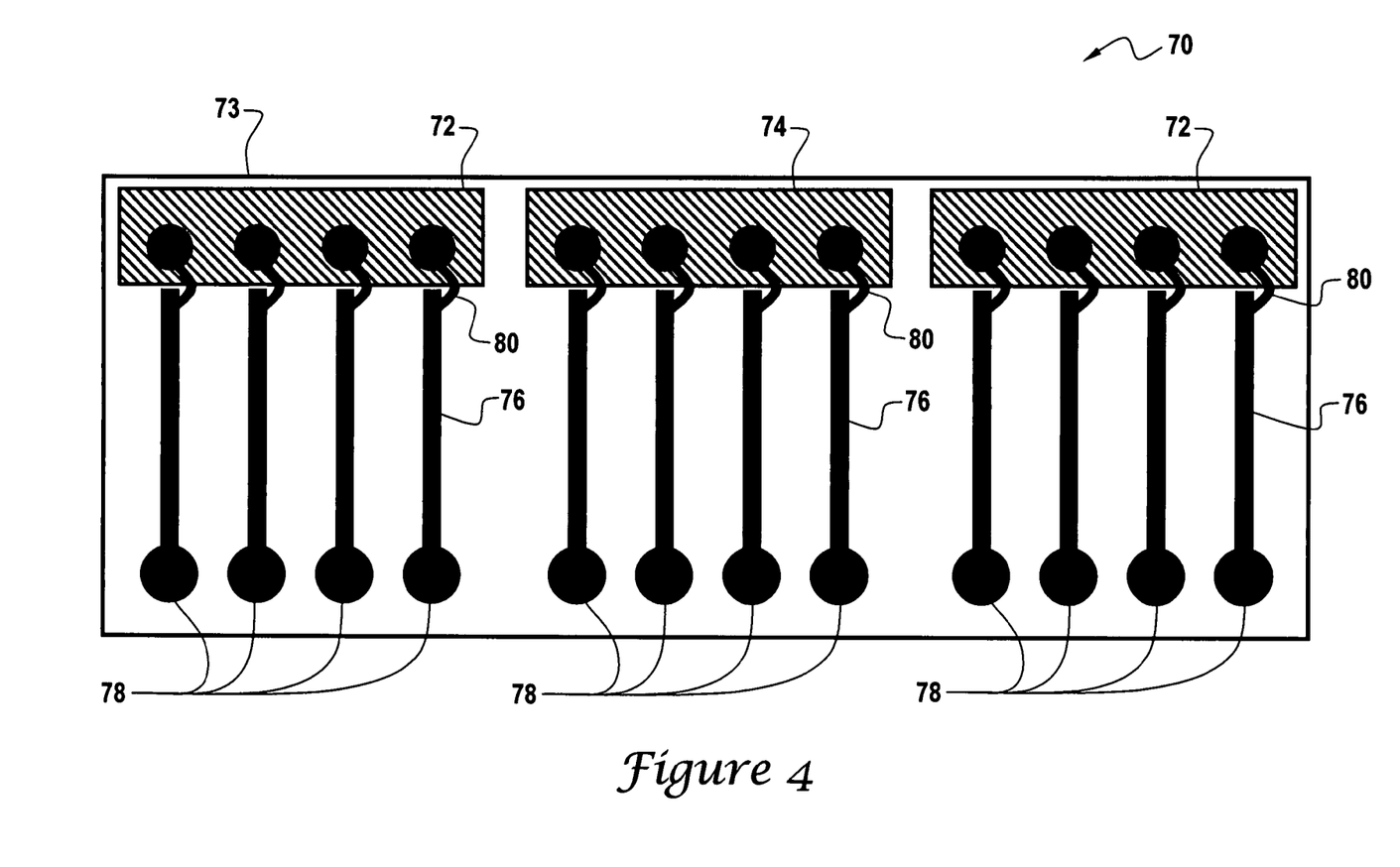
FIG. 4 illustrates a top down view of an opto-electronic semiconductor array that includes VCSEL arrays and a photodetector array.

The present invention provides housing for opto-electronic semiconductor arrays devices such that those semiconductor arrays optically connect to optical fibers and electrically connect to the external environment. FIG. 4 illustrates an opto-electronic semiconductor array device 70 that is comprised of two VCSEL array substrates 72 (on the left and right sides) and a photodetector array substrate 74 (in the middle) that are mounted on a die 73. The die 73 is beneficially comprised of a flat, temperature stable ceramic plate having conductive leads 76 that terminate in conductive pads 78. Bonding leads 80 connect the individual VCSEL/detector array elements to the conductive patterns 76.

With reference to the opto-electronic semiconductor array device 70 of FIG. 4, ceramic is particularly beneficial because of its high thermal conductivity, which minimizes thermal gradients, and because it is dimensionally stable over temperature. Ceramics are also beneficial because of its reasonable cost, and wide availability. An alternative body material is silicon. While FIG. 4 illustrates both VCSEL array substrates 72 and a detector array substrate 74, typically a particular opto-electronic semiconductor array device 70 would have a VCSEL array substrate, a detector array substrate, or some other type of opto-electronic array. At the present time, VCSEL arrays are often 1×12 arrays.

Figure 5:
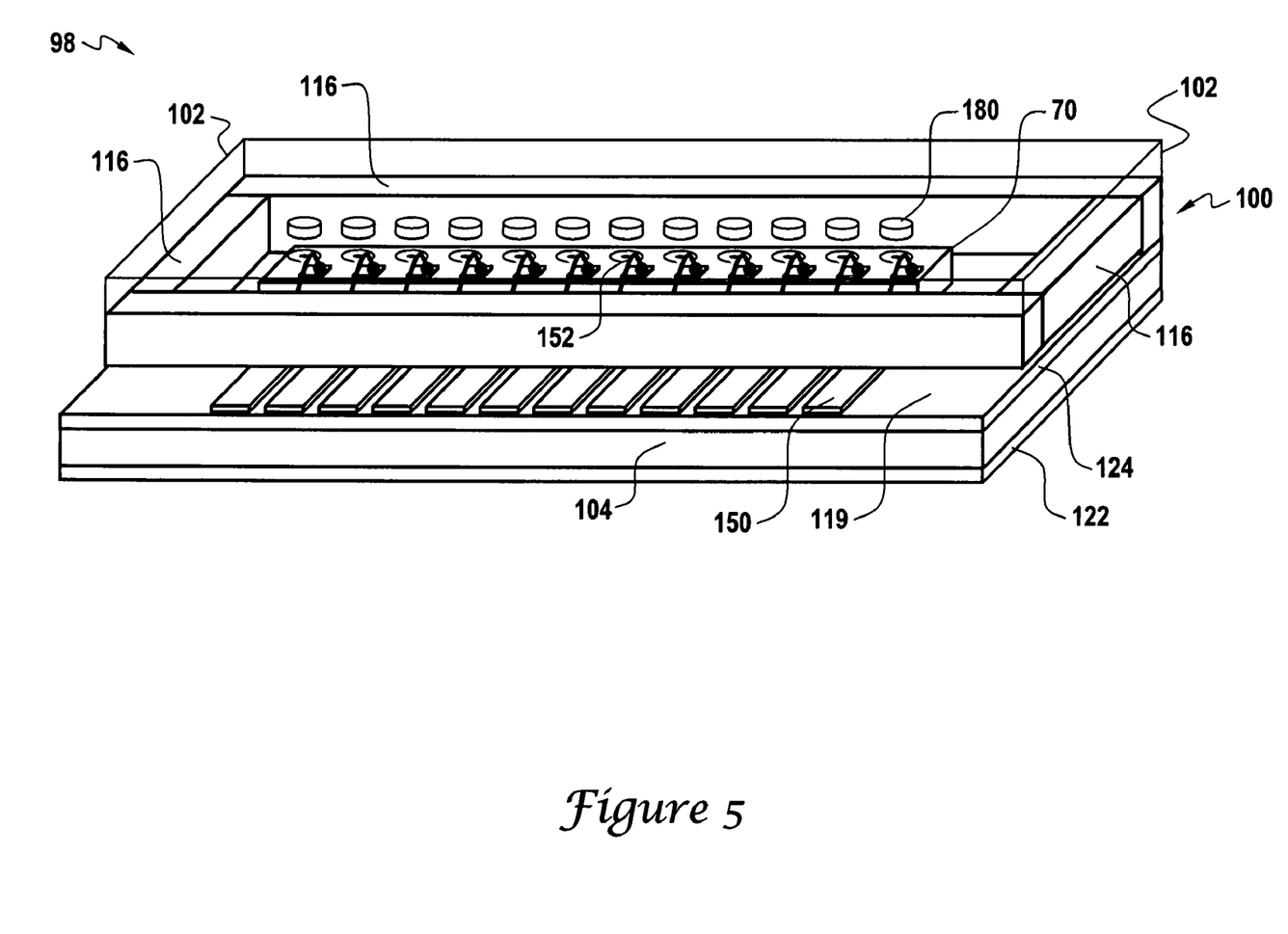
FIG. 5 illustrates a perspective view of 12 element VCSEL array that is packaged in a housing assembly having a micro lens array on a top transparent substrate and that is in accord with the principles of the present invention.

According to the principles of the present invention, the opto-electronic semiconductor array device 70 is packaged in a housing. FIG. 5, a top perspective view, and FIG. 6B, a side cut-away view, illustrate a suitable housing 98. The housing 98 is beneficially comprised of a ceramic submount 100 and a top transparent substrate 102. Beneficially, a glass substrate, for example, may be used for the top transparent substrate 102. The submount 100 is comprised of a base 104, a set of sidewalls 116, and a bonding base 119. As shown, the top transparent substrate 102 rests on the sidewalls 116 and the sidewalls 116 rest either on the base 104 or on the bonding base 119. A hermetic seal is formed between the sidewalls 116 and the top transparent substrate 102 using, for example, an epoxy.

Figure 6A:
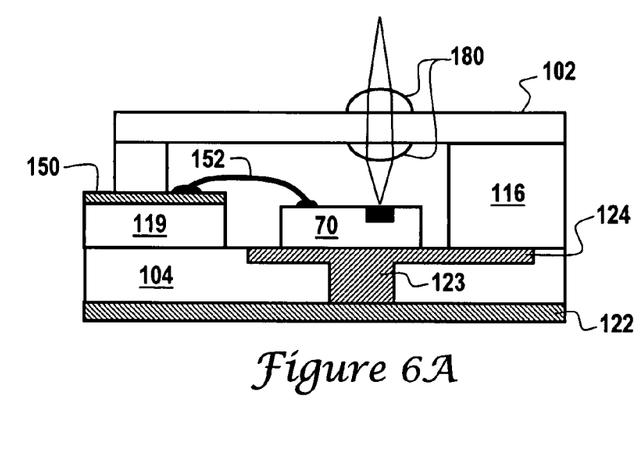
Figure 6B:
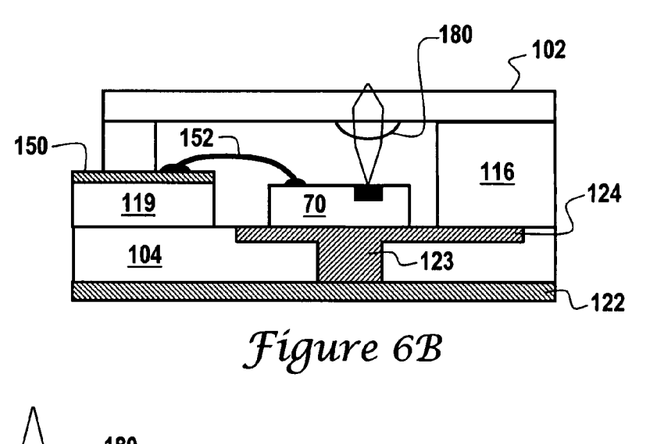

Still referring to FIGS. 5 and 6B, the sidewalls 116, the base 104, and the bonding base 119 are structurally configured such that they form a fenced depression or cavity. The opto-electronic semiconductor array device 70 is mounted within the fenced depression into which the opto-electronic semiconductor array device 70 is attached. Attachment is beneficially performed using an epoxy or other type of adhesive, preferably a thermally conductive and dimensionally stable adhesive. Additionally, the sidewalls 116, the base 104, and the bonding base 119 are beneficially comprised of beryllia. Alternatively, alumina is a good choice. Both materials have high thermal conductivity and dimensional stability.

Still referring to FIGS. 5 and 6B, the top transparent substrate 102, the sidewalls 116, the base 104, and the bonding base 119 protect the opto-electronic semiconductor array device 70. The base transfers heat from the opto-electronic semiconductor array device 70 to an external heat sink. Furthermore, the bonding base 119 includes a plurality of conductive traces 150 that substantially span the width of the bonding base 119. Bonding wires 152 electrically connect the conductive traces 150 to the opto-electronic semiconductor array device 70. As shown in FIGS. 5 and 6B, the base 104 is further comprised of a first common electrode 122 at the bottom of the base 104, a second common electrode 124 on the base 104 (in this instance, FIG. 6B shows the surface of second common electrode 124 flush with the surface of the base 104), and a third common electrode between the second common electrode 124 and the first common electrode 122. The first, second and third common electrodes are made of an electrical conductor to operate the opto-electronic semiconductor array device 70 in conjunction with the conductive traces 150 and the bonding wires 152. Meanwhile, the conductive traces 150 are available for electrical connections to the exterior environment.

Preferably, the sidewalls 116, the base 104, and the bonding base 119 are integrally connected. This is beneficially performed by forming the sidewalls 116, the base 104, and the bonding base 119 together in a green state and then firing the elements to form an integral package. If that is performed, the conductive traces 150 are beneficially comprised of high melting point (refractory-type) metals.

Figure 6C:
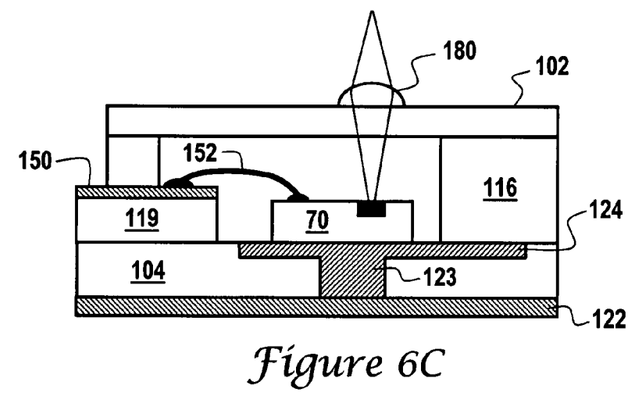
Figure 7:
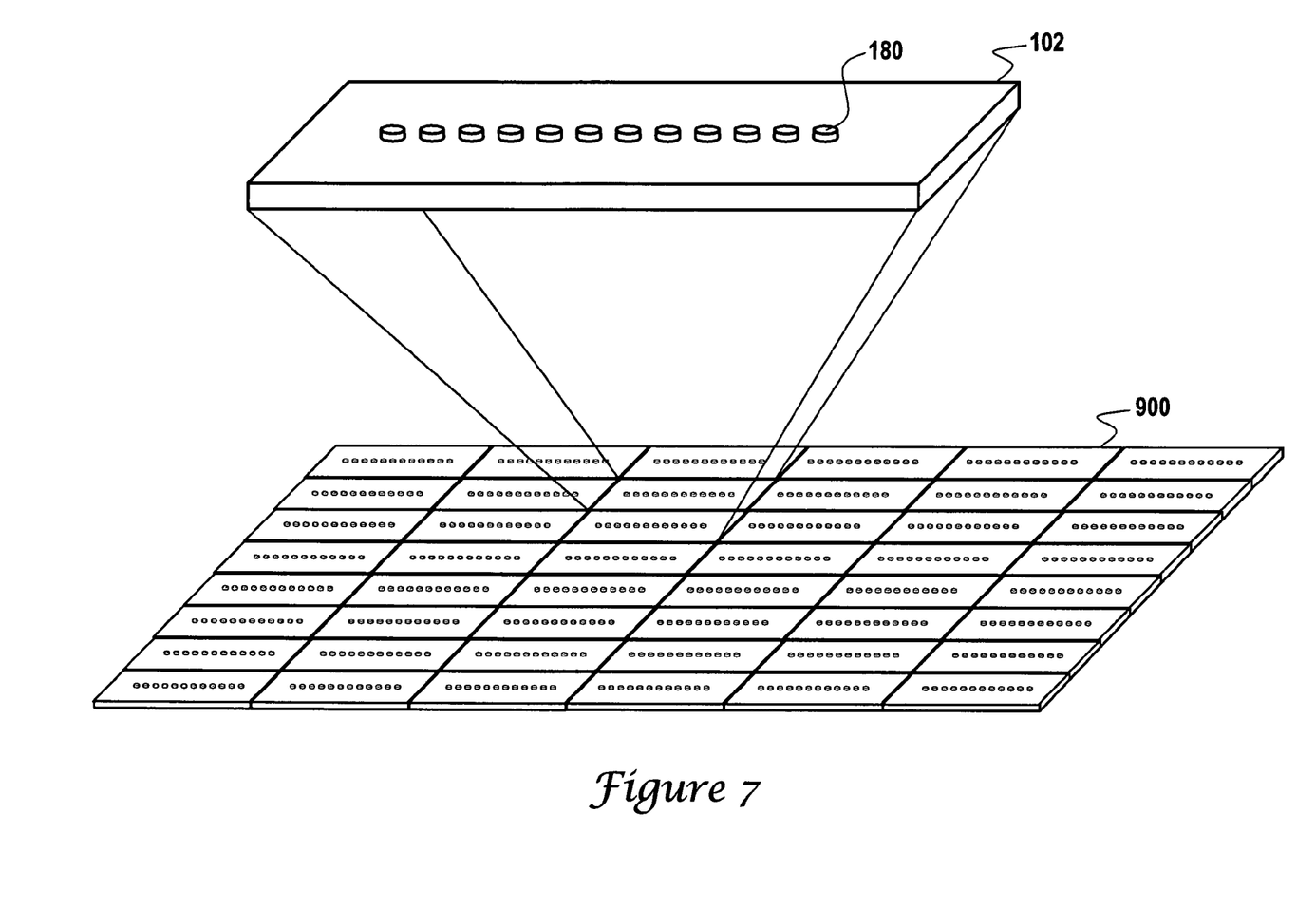
FIG. 7 illustrates the production of a micro-lens on a top transparent substrate from a large transparent substrate.

Still referring to FIGS. 5 and 6B, an array of micro-lenses 180 is on the top transparent substrate 102. The micro-lenses 180 can be located on either side or both sides of the top transparent substrate 102, as shown in FIGS. 6A–6C. Referring now to FIG. 7, the micro-lens array 180 is formed on a large transparent substrate 900 such as a glass, and dicing the large transparent substrate 900 into a smaller unit forms the top transparent substrate 102 with the micro-lens array 180. Each micro lens 180 is beneficially comprised of a nonconductive, optical grade epoxy that is ejected by a micro inkjet nozzle onto the top transparent substrate 102 and then cured by ultra violet light. Examples of ink jet methods of producing optical element are disclosed in detail in U.S. Pat. Nos. 5,498,444 and 5,707,684, which are incorporated by reference.

Producing micro lenses 180 via micro inkjet ejection provides a fast and easy lens fabrication method that is suitable for large-scale manufacturing. Furthermore, the production parameters for an array of micro lens 180 may be changed without changing the production line equipment since a simple, computerized program may be used to control production of individual micro lenses 180. The size and position of each micro lens 180 depends on the material's index of refraction, surface tension, and the adhesive characteristics of the top transparent substrate. Some experimentation will likely be required. However, the goal is to produce micro lenses 180 having well-defined optical characteristics.

It can be beneficial to use micro inkjet ejection fabrication of micro lens 180 to ensure precisely dimensioned and precisely located micro lenses 180 that enable optical alignment of opto-electronic elements. This alignment should be well controlled to assist rapid fabrication. To that end, the height of the sidewalls 116 and the bonding base 119 should be accurately controlled. Furthermore, the dimensions of the opto-electronic semiconductor array device 70 and of the micro lenses 180 should also be well controlled. This will result in accurate focal positions of the optical elements with the micro-lenses 180. In addition, the thickness of the adhesives used to attach the top transparent substrate 102 and the opto-electronic semiconductor array device 70 should also be well controlled. Furthermore, that alignment must remain constant over time and temperature. It may be beneficial to seal the top transparent substrate 102 to the sidewalls 116 to prevent contaminates from entering the interior of the housing 98.

The top transparent substrate 102 with the micro-lens array 180 can be manufactured at a low cost according to the principles of the present invention. Moreover, a hermetic seal of the opto-electronic semiconductor array device 70 is possible. In addition, the top transparent substrate 102, beneficially a glass substrate, with the micro-lens array 180 has a very good CTE match with the opto-electronic semiconductor array device 70 according to the principles of the present invention. Finally regarding the lenses, while the foregoing has assumed the use of micro-lenses, the principles of the present invention also encompass other types of lenses. For example, the opto-electronic semiconductor array device 70 could include on-board lenses, or other types of lenses could be used (for example, Fresnel lenses formed into the glass).

Figure 8:
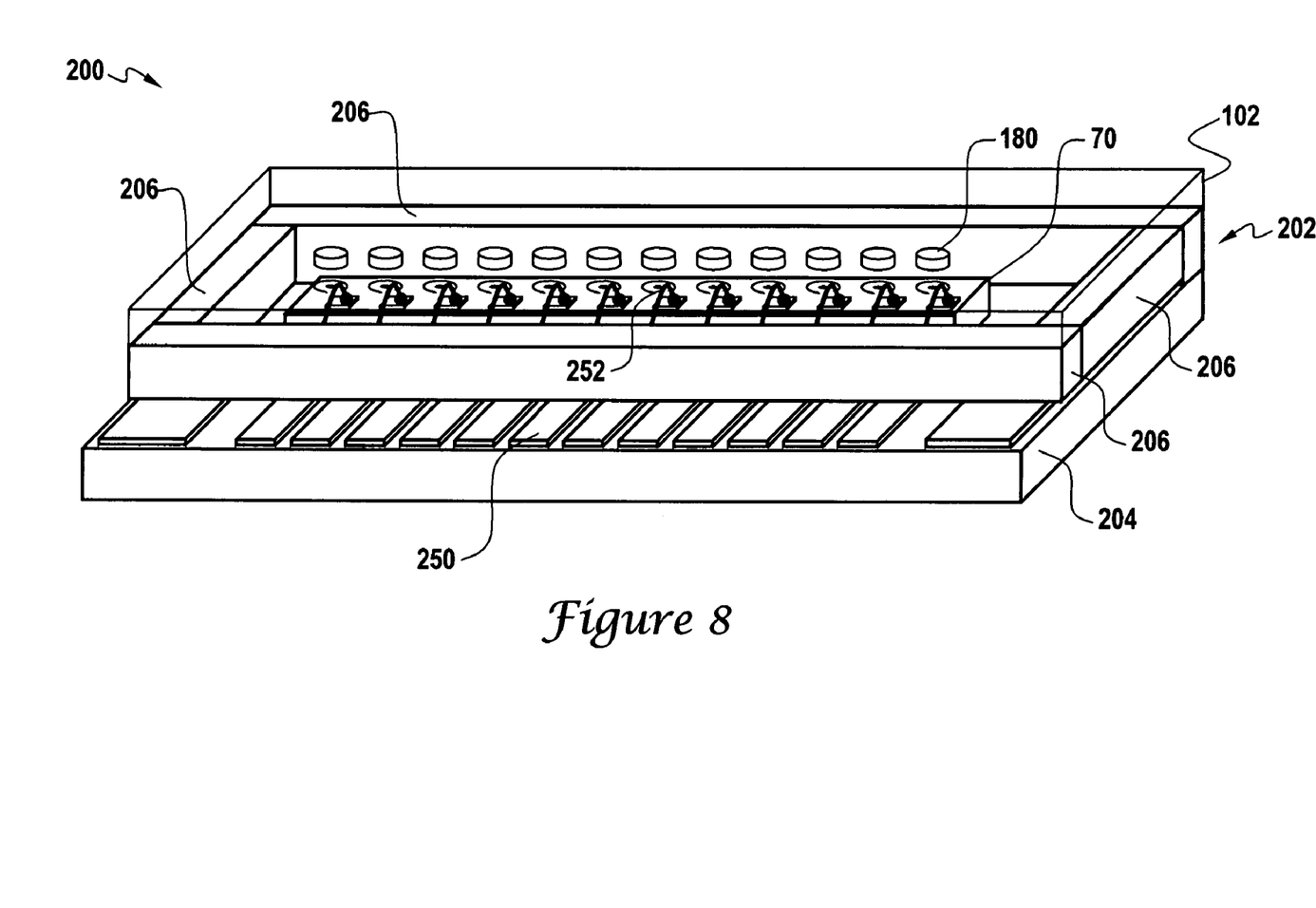
FIG. 8 illustrates a perspective view of an alternative housing assembly that is in accord with the principles of the present invention.
Figure 9:
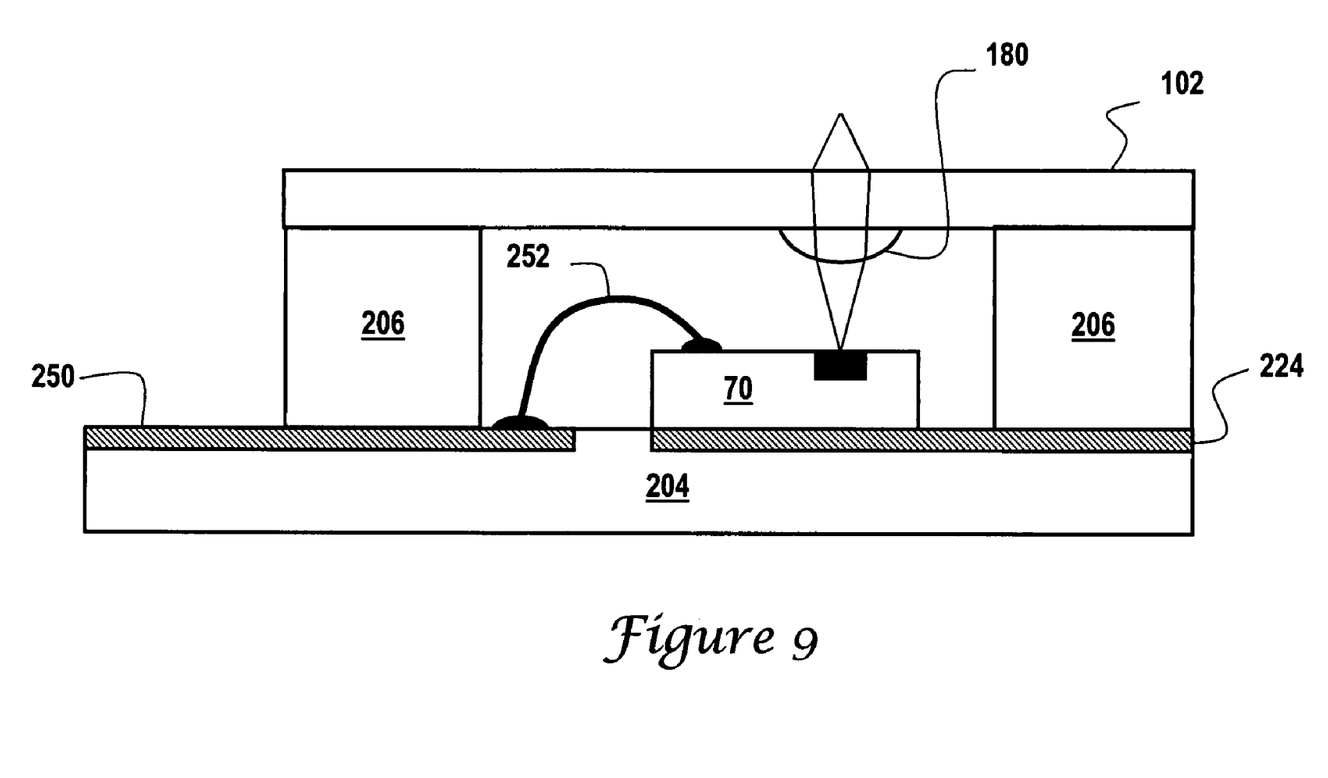
FIG. 9 illustrates a side cut-away view of the alternative housing assembly shown in FIG. 5.

FIGS. 8 and 9 illustrate an alternative housing package 200 that is also in accord with the principles of the present invention. FIG. 8, a top perspective view, and FIG. 9, a side cut-away view, illustrate an alternative housing package 200. The housing package 200 is beneficially comprised of a ceramic submount 202 and a top transparent substrate 102. Beneficially, a glass substrate may be used for the top transparent substrate 102. The submount 202 is comprised of a base 204 and of a set of walls 206. As shown, the top transparent substrate 102 rests on the walls 206, which rest on the base 204. A hermetic seal is formed between the walls 206 and the top transparent substrate 102 using, for example, an epoxy.

Still referring to FIG. 8, the walls 206 and the base 204 form a fenced region. An opto-electronic semiconductor array device 70 is mounted within the fenced region. Mounting is beneficially performed using an epoxy or other adhesive, preferably a thermally conductive and dimensionally stable adhesive. The walls 206 and the base 204 are beneficially comprised of beryllia. Alternatively, alumina is a good choice. Both materials have high thermal conductivity and dimensional stability. As shown, the top transparent substrate 102 includes micro-lenses 180 (discussed above).

The base 204 includes a plurality of conductive traces 250 that span the width of the front wall 206 and a common electrode 224. Thus, the front of the conductive traces 250 are externally exposed, while the back of the conductive traces 250 are internally exposed. Bonding wires 252 electrically connect the back of the conductive traces 250 to the opto-electronic semiconductor array device 70. The common electrode 224 is made of an electrical conductor such that it is provided to operate the opto-electronic semiconductor array device 70 in conjunction with the conductive traces 250 and the bonding wires 252. Meanwhile, the front of the conductive traces 250 are available for external electrical connections.

The embodiments and examples set forth herein are presented to explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A semiconductor package, comprising:
    a submount having a base, a cavity defined by side walls on the base, a bonding portion, and a plurality of conductive traces on the bonding portion, wherein a first conductive material is embedded in a surface of the base, the first conductive material receiving an optical device and wherein the first conductive material functions as a heat sink;
    a transparent substrate on the side walls and covering the cavity; and
    a micro lens coupled to the transparent substrate;
    wherein said submount and said transparent substrate define an enclosed interior region; and
    wherein said conductive traces extend from the enclosed interior region to an exterior region for electrical connection.

2. A semiconductor package according to claim 1, wherein the transparent substrate includes glass.

3. A semiconductor package according to claim 1, wherein the side walls are made of nonconductive material and the side walls extend upward from the base.

4. A semiconductor package according to claim 1, further comprising a first common electrode beneath the base of the submount.

5. A semiconductor package according to claim 4, wherein the cavity is defined by the base and the side walls, a portion of the surface of the base being made of a conductive material, wherein the first common electrode is in electrical contact with the conductive material through a second common electrode, the second common electrode being imbedded in the base.

6. A semiconductor package according to claim 1, wherein the bonding portion includes a bonding base and the conductive traces are on a surface of the bonding base.

7. A semiconductor package according to claim 1, wherein the cavity is further defined by the bonding base.

8. A semiconductor package according to claim 1, wherein the cavity includes an optical device, the optical device being positioned on the base inside the cavity and the optical device being electrically connected to the conductive traces.

9. A semiconductor package according to claim 1, wherein the transparent substrate and the submount are hermetically sealed.

10. A semiconductor package according to claim 1, wherein the micro lens is an array of micro lens attached to the transparent substrate at a position aligned with an optical device to be placed in the cavity.

11. A semiconductor package according to claim 1, wherein the micro lens is attached to the transparent substrate on a top surface, a bottom surface or both.

12. A semiconductor package according to claim 1, wherein the cavity receives an optical device including a vertical cavity semiconductor emitting laser (VCSEL), a photodetector or both.

13. A semiconductor package according to claim 1, wherein the base of the submount includes ceramic.

14. A semiconductor package according to claim 13, wherein said ceramic material is one of alumina and beryllia.

15. A semiconductor package according to claim 1, wherein the base, the side walls and the bonding portion are integrally attached to form the cavity that is hermetically sealed.

16. A semiconductor package according to claim 1, wherein
   the cavity is defined by the base and the side walls made of nonconductive material, the base having a portion of the surface made with a conductive material;
   the side walls extend upward from the base of the submount;
   the transparent substrate and the submount are hermetically sealed;
   the micro lens is attached to the transparent substrate on a top surface, a bottom surface or both; and
   the cavity is to receive an optical device including a vertical cavity semiconductor emitting laser (VCSEL), a photodetector or both.

17. A semiconductor package according to claim 16, further comprising a first common electrode beneath the base of the submount, the first common electrode being in electrical contact with the conductive material.

18. A semiconductor package, comprising:
   a submount having a base, a cavity defined by side walls on the base, a bonding portion, and a plurality of conductive traces on the bonding portion, wherein a conductive material is embedded in a surface of the base, the conductive material receiving an optical device and wherein the first conductive material functions as a heat sink;
   means for covering the cavity with a transparent substrate; and
   means for coupling a micro lens to the transparent substrate;
   wherein said submount and said transparent substrate define an enclosed interior region; and
   means for extending the conductive traces extend from the enclosed interior region to an exterior region for electrical connection.

19. A semiconductor package according to claim 18, wherein
   the side walls extend upward from the base of the submount;
   the transparent substrate and the submount are hermetically sealed;
   the micro lens is attached to the transparent substrate on a top surface, a bottom surface or both; and
   the cavity is to receive an optical device including a vertical cavity semiconductor emitting laser (VCSEL), a photodetector or both.

20. A semiconductor package according to claim 19, further comprising a first common electrode beneath the base of the submount, the first common electrode being in electrical contact with the conductive material.

21. A semiconductor package, comprising:
   a submount having a ceramic base and ceramic side walls, the ceramic base including first and second surfaces;
   a transparent substrate on the side walls of the submount defining an enclosed interior region;
   a micro lens coupled to the transparent substrate; and
   a vertical cavity semiconductor emitting laser (VCSEL) over the first surface of the base,
   wherein the first and second surfaces of the base include first and second conductive materials, respectively, and the first and second conductive materials are electrically connected to each other.

22. A semiconductor package according to claim 21, further comprising an array device on the first surface of the base, the array device including the VCSEL.

23. A semiconductor package according to claim 21, wherein the first conductive material is embedded in a portion of the first surface of the base.

* * * * *